United States Patent
Kang et al.

(10) Patent No.: US 7,876,157 B1
(45) Date of Patent: Jan. 25, 2011

(54) POWER AMPLIFIER BIAS CIRCUIT HAVING CONTROLLABLE CURRENT PROFILE

(75) Inventors: Li-hung Kang, Gilbert, AZ (US); Younkyu Chung, Thousand Oaks, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 12/535,391

(22) Filed: Aug. 4, 2009

(51) Int. Cl.
*H03G 3/10* (2006.01)
(52) U.S. Cl. .................................. 330/285; 330/296
(58) Field of Classification Search ............... 330/285, 330/288, 296
See application file for complete search history.

(56) References Cited

U.S. PATENT DOCUMENTS

| | | | |
|---|---|---|---|
| 6,819,185 B1 * | 11/2004 | Jensen | 330/296 |
| 6,992,524 B2 | 1/2006 | Yang et al. | |
| 7,262,666 B2 * | 8/2007 | Luo | 330/296 |
| 7,332,968 B2 * | 2/2008 | Luo | 330/296 |
| 7,355,480 B2 * | 4/2008 | Honda | 330/296 |
| 7,365,604 B2 * | 4/2008 | Luo et al. | 330/296 |

* cited by examiner

*Primary Examiner*—Henry K Choe
(74) *Attorney, Agent, or Firm*—Michael J. Tempel; Smith Frohwein Tempel Greenlee Blaha LLC (57) ABSTRACT

A power amplifier bias circuit having a controllable current profile includes a first transistor device configured as a switch, and configured to receive a non-regulated system voltage, and a plurality of resistors configured to provide a current and configured to determine an amount of a bias current that flows through a second transistor device, where the second transistor device is part of a current mirror comprising a third transistor device and the amount of bias current flowing through the second transistor device determines a power output of the third transistor device.

19 Claims, 5 Drawing Sheets

POWER AMPLIFIER BIAS CIRCUIT HAVING CONTROLLABLE CURRENT PROFILE

BACKGROUND

Portable communication devices, such as cellular telephones, use one or more power amplifiers to amplify an information signal prior to transmission. The power amplifiers are typically implemented as one or more stages of transistors and related circuitry. In most applications, the operating point of the transistor is set by providing a bias current or voltage to one of the terminals of the transistor. In the case of a bipolar junction transistor (BJT) the bias current is normally applied to the base terminal of the transistor to control the parameters under which the transistor will conduct between its collector and emitter terminals. A typical bias circuit should be able to provide the desired bias conditions (i.e., current) over a wide supply and battery voltage range. In the past, a regulated constant voltage has been used as the source of the bias signal, thus creating a fixed bias condition.

However, since the gain, linearity and efficiency of a power amplifier are very sensitive to the bias conditions of particular transistors in use, it is a technical challenge to maintain an optimal bias point at different supply voltages in order to maximize the overall performance of the power amplifier.

Traditional bias circuits have used what is referred to as a current mirror to provide a fixed bias current over a supply voltage range. The bias condition is determined by the particular bias profile at a given supply voltage, unless a controllable reference voltage supply is used to change the bias condition. However, such an approach is costly and complex because it requires additional circuitry to provide the reference voltage, thereby increasing the circuit complexity. Because of the fixed current profile in existing bias circuits, the performance of the power amplifier is optimized at only the nominal supply voltage condition. This situation results in degraded power amplifier performance at other supply voltages.

Furthermore, even when the power amplifier is switched off there are many active transistors in the power amplifier circuit that are not completely turned off, thus leading to leakage current flow in the device. This shortens standby time for the device in which the power amplifier is implemented.

Therefore, it would be desirable to be able to bias a power amplifier over a wide range of supply voltage and also be able to minimize the leakage current of the transistors in the power amplifier in order to improve standby time.

SUMMARY

Embodiments of the invention include a power amplifier bias circuit having a controllable current profile, comprising a first transistor device configured as a switch and configured to receive a non-regulated system voltage, and a plurality of resistors configured to provide a current and configured to determine an amount of a bias current that flows through a second transistor device, where the second transistor device is part of a current mirror comprising a third transistor device, and the amount of bias current flowing through the second transistor device determines a power output of the third transistor device.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the power amplifier bias circuit having controllable current profile can be implemented in any device that uses a power amplifier biased by current. Further, the circuitry to be described below can be fabricated using an integrated bipolar-field effect transistor (BIFET) process utilizing the relative lower turn-on voltage of FET transistors. Further, in particular embodiments, the transistors to be described below comprise bipolar junction transistors (referred to as a BJT), which includes heterojunction bipolar junction transistors (referred to as an HBT) and field effect transistors (referred to as a FET) that are fabricated using what is referred to as the bipolar complementary metal oxide semiconductor (BiCMOS) process.

The power amplifier bias circuit having controllable current profile is generally implemented in hardware. However, one or more of the signals that control the power amplifier bias circuit having controllable current profile can be implemented in software, or a combination of hardware and software. When implemented in hardware, the power amplifier bias circuit having controllable current profile can be implemented using specialized hardware elements. When one or more of the control signals for the power amplifier bias circuit having controllable current profile are generated at least partially in software, the software portion can be used to precisely control the operating aspects of various components in a power amplifier bias circuit associated with a communications device. The software can be stored in a memory and executed by a suitable instruction execution system (microprocessor). The hardware implementation of the power amplifier bias circuit having controllable current profile can include any or a combination of the following technologies, which are all well known in the art: discrete electronic components, a discrete logic circuit(s) having logic gates for implementing logic functions upon data signals, an application specific integrated circuit having appropriate logic gates, a programmable gate arrays) (PGA), a field programmable gate array (FPGA), a separate, specially designed integrated circuit for biasing purposes, etc.

Figure 1:
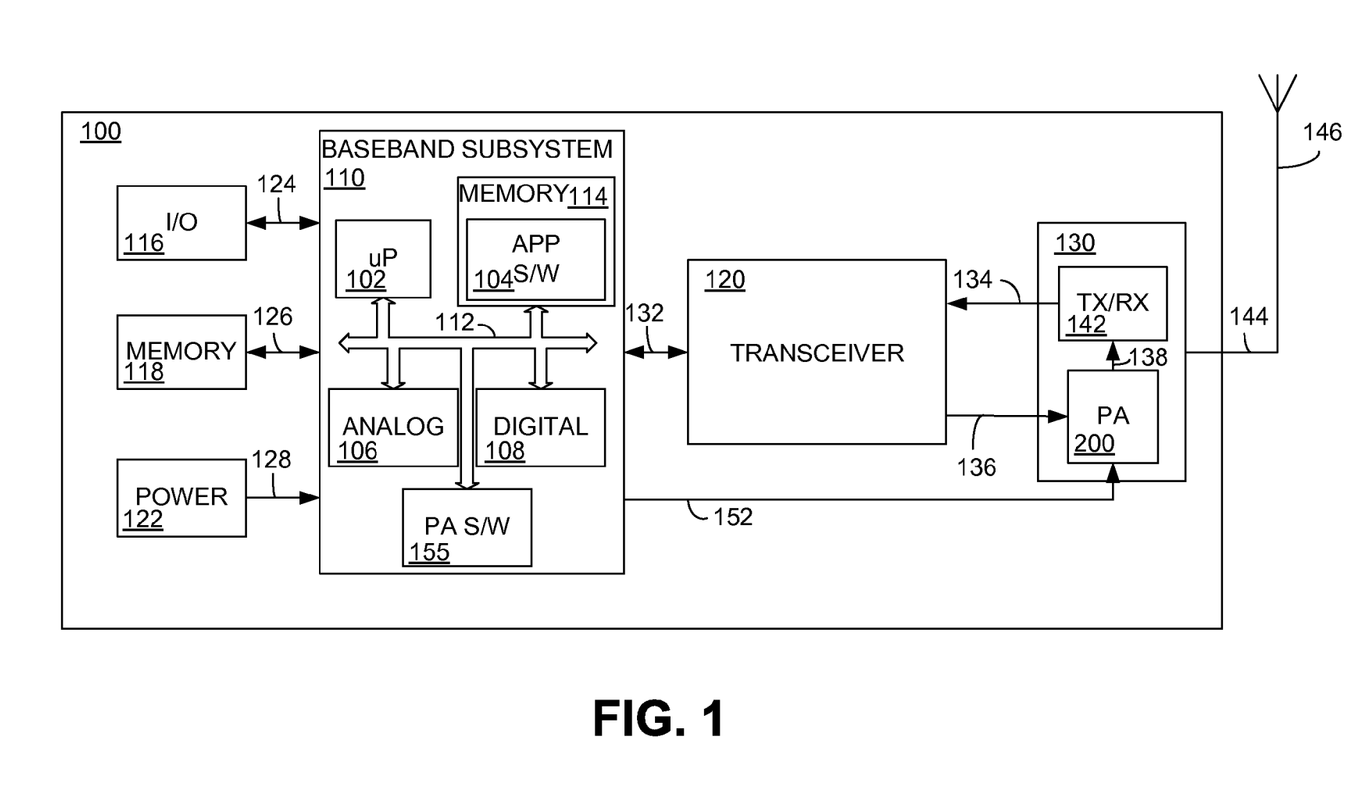
FIG. 1 is a block diagram illustrating a simplified portable communication device.

FIG. 1 is a block diagram illustrating a simplified portable communication device 100. In an embodiment, the portable communication device 100 can be a portable cellular telephone. Embodiments of the power amplifier bias circuit having controllable current profile can be implemented in any device having an RF transmitter, and in this example, are implemented in a portable communication device 100. The portable communication device 100 illustrated in FIG. 1 is intended to be a simplified example of a cellular telephone and to illustrate one of many possible applications in which the power amplifier bias circuit having controllable current profile can be implemented. One having ordinary skill in the art will understand the operation of a portable cellular telephone, and, as such, implementation details are omitted. The portable communication device 100 includes a baseband subsystem 110, a transceiver 120, and a front end module (FEM) 130. Although not shown for clarity, the transceiver 120 generally includes modulation and upconversion circuitry for preparing a baseband information signal for amplification and transmission, and includes filtering and downconversion circuitry for receiving and downconverting an RF signal to a baseband information signal to recover data. The details of the operation of the transceiver 120 are known to those skilled in the art.

The baseband subsystem generally includes a processor 102, which can be a general purpose or special purpose microprocessor, memory 114, application software 104, analog circuit elements 106, digital circuit elements 108 and power amplifier software 155, coupled over a system bus 112. The system bus 112 can include the physical and logical connections to couple the above-described elements together and enable their interoperability.

An input/output (I/O) element 116 is connected to the baseband subsystem 110 over connection 124, a memory element 118 is coupled to the baseband subsystem 110 over connection 126, and a power source 122 is connected to the baseband subsystem 110 over connection 128. The I/O element 116 can include, for example, a microphone, a keypad, a speaker, a pointing device, user interface control elements, and any other device or system that allows a user to provide input commands and receive outputs from the portable communication device 100.

The memory 118 can be any type of volatile or non-volatile memory, and in an embodiment, can include flash memory. The memory element 118 can be permanently installed in the portable communication device 100, or can be a removable memory element, such as a removable memory card.

The power source 122 can be, for example, a battery, or other rechargeable power source, or can be an adaptor that converts AC power to the correct voltage used by the portable communication device 100. In an embodiment, the power source can be a battery that provides a nominal voltage output of approximately 3.0 volts (V). However, the output voltage range of the power source can range from approximately 1.0 to 5.0 V.

The processor 102 can be any processor that executes the application software 104 to control the operation and functionality of the portable communication device 100. The memory 114 can be volatile or non-volatile memory, and in an embodiment, can be non-volatile memory that stores the application software 104. If portions of the control logic of the power amplifier bias circuit having controllable current profile are implemented in software, then the baseband subsystem 110 also includes power amplifier software 155, which may cooperate with control logic that can be executed by the microprocessor 102, or by another processor, to control at least some aspects of the operation of the power amplifier bias circuit having controllable current profile and/or the power amplifier 200 to be described below.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a digital signal processor (DSP), a field programmable gate array (FPGA), or any other processing device. Because the baseband subsystem 110 includes both analog and digital elements, it is sometimes referred to as a mixed signal device (MSD).

In an embodiment, the front end module 130 includes a transmit/receive (TX/RX) switch 142 and a power amplifier 200. The TX/RX switch 142 can be a duplexer, a diplexer, or any other physical or logical device or circuitry that separates a transmit signal and a receive signal. Depending on the implementation of the portable communication device 100, the TX/RX switch 142 may be implemented to provide half-duplex or full-duplex functionality. A transmit signal provided by the transceiver 120 over connection 136 is directed to the power amplifier 200. As will be described in detail below, the power amplifier 200 can be implemented to include a bias circuit for generating a bias signal over a range of source voltage levels that efficiently provide a bias signal, typically in the form of a bias current, to the power amplification device irrespective of the battery voltage, and in a way that minimizes leakage current when the power amplifier 200 is switched off. The output of the power amplifier 200 is provided over connection 138 to the TX/RX switch 142, and then to an antenna 146 over connection 144.

A signal received by the antenna 146 is provided over connection 144 to the TX/RX switch 142, which provides the received signal over connection 134 to the transceiver 120.

In an embodiment, the baseband subsystem 110 provides one or more control signals to the power amplifier 200 over connection 152. Connection 152 can be implemented as discrete connections, or as a bus having multiple signals.

Figure 2:
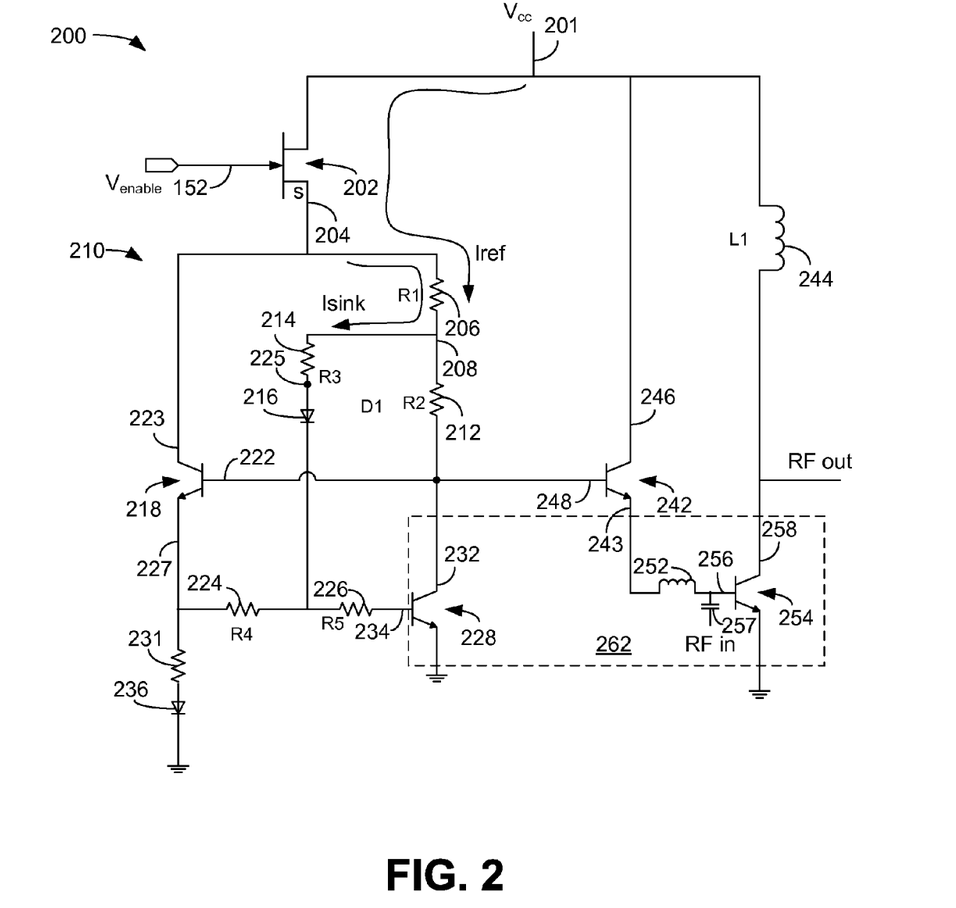
FIG. 2 is a schematic diagram illustrating a power amplifier system including an embodiment of a power amplifier bias circuit having controllable current profile.

FIG. 2 is a schematic diagram illustrating a power amplifier system including an embodiment of a power amplifier bias circuit having controllable current profile. The power amplifier system 200 comprises bias circuit 210 that comprises a transistor device 202, which receives a non-regulated supply system voltage signal, Vcc, which can also be referred to as a battery voltage signal, Vbatt, over connection 201. In an embodiment, the connection 201 forms the drain connection of the transistor device 202. In the embodiment shown in FIG. 2 the transistor device 202 is a field effect transistor (FET), and can be a metal oxide semiconductor (MOS) FET, a metal semiconductor (MES) FET, or any other type of FET.

An enable signal, supplied via connection 152, is provided to the gate terminal of the transistor device 202. When the enable signal on connection 152 is active, or logic high, the transistor device 202, acting as a switch, becomes conductive. When conductive, the source terminal 204 of the transistor device 202 communicates the voltage signal, Vcc, onto connection 204, which also forms the source terminal of the transistor device 202. By controlling the connectivity of the non-regulated supply system voltage signal, Vcc, to the bias circuit 210, the transistor device 202 also effectively minimizes leakage current when switched off by the enable signal 152.

The power amplifier system 200 also includes a transistor device 218, a transistor device 228, a transistor device 242, and a transistor device 254. The transistor device 254 represents one of a number of possible radio frequency (RF) power amplification stages. A radio frequency (RF) input signal is coupled to the base terminal 256 of the transistor device 254 through a capacitor 257. The collector terminal 258 of the transistor device 254 is coupled through an inductor 244 to the system voltage, Vcc, on connection 201. The collector terminal 258 of the transistor device 254 provides the RF output of the power amplifier system 200. The transistor devices 218, 228, 242 and 254 are bipolar junction transistor (BJT) devices.

A collector terminal 223 of the transistor device 218 is coupled to the system voltage, Vcc, on connection 204, when the transistor device 202 is conductive. The transistor device 218 has its emitter terminal 227 connected to system ground through a resistor 231 and a diode 236. In an embodiment, the diode 236 can be the collector-base junction of a transistor device, or can be another diode. The collector terminal 232 of the transistor device 228 is connected through resistors 206 and 212 to the system voltage, Vcc, on connection 204. A resistor 214 is connected between node 208 and a diode 216. The diode 216 is similar to the diode 236. Although described as collector-base junctions of transistor devices, the diodes 236 and 216 can be formed using other diode technologies, such as, for example, conventional PN diodes.

The base terminal 234 of the transistor device 228 is coupled through a resistor 226 and through a resistor 224 to the emitter terminal 227 of the transistor device 218.

The collector terminal 246 of the transistor device 242 is connected to the system voltage, Vcc, on connection 201, and also has its emitter terminal 243 connected through an inductor 252 to the base terminal 256 of the transistor device 254. The transistor devices 228 and 254 form a current mirror 262, as known to those skilled in the art. The transistor devices 218, 228, and 242, and the resistors 206, 212, and 214 form a current source that provides current to and controls the output of the transistor device 254.

The values of the resistors 206, 212, 214 and 224 determine the amount of current that flows through the transistor device 228, thereby controlling the power output of the transistor device 254. Therefore, the values of the resistors 206, 212, 214 and 224 control the profile of the bias current that ultimately controls the power output of the power amplifier system 200. The value of each of the resistors 206, 212, 214 and 224 is chosen to result in a corresponding bias current that is related to a level of the system voltage, Vcc. Further, the value of each of the resistors 206, 212, 214 and 224 is chosen to result in a corresponding bias current profile that changes over a range of the non-regulated system voltage.

In an example in which there are two power amplification stages (i.e., where there are two such transistor devices 254 (and related circuitry) coupled in series as a driver stage and an output stage), the values of the resistors 206, 212, 214 and 224 can be 750 ohm (Ω), 60Ω, 200Ω, and 300Ω, respectively, for a first amplification stage; and the values of the resistors 206, 212, 214 and 224 can be 850 ohm (Ω), 60Ω, 150Ω, and 300Ω, respectively, for a second amplification stage. When implemented as shown in FIG. 2 using fixed value resistances, there will be a single current profile over a given range of battery voltage for each amplification stage. A variable current profile can be created for each amplification stage by implementing variable resistances, as will be described below.

In the implementation described herein, the transistor device 218 is referred to as a "beta helper" for the transistor device 228. The transistor device 242 operates as a buffer transistor, thereby isolating the bias circuit 210 from any RF signal on the base terminal 256 of the transistor device 254.

As a further control of the bias current, the diode 216 and the diode 236 adjust the DC voltage drop across the resistor 214, thus controlling the base current at the base terminal 234 of the transistor device 228. The current Isink varies depending upon the voltage that appears at the node 225 between the resistor 214 and the diode 216. Depending upon the type of diode 216 implemented, the voltage at node 225 changes, thereby providing at least some adjustability, depending on the type of diode function implemented. By carefully selecting the values of the resistors 206, 212, 214, 224 and 226, and the parameters of the diodes 216 and 236, the ratio of the current Iref into the collector terminal 232 of the transistor device 228 to the current Isink through the resistance 214, can be determined based on a particular system voltage, Vcc. In addition, the value of the resistor 224, and to a lesser degree, the value of the resistor 226 influences the current Isink because the majority of the current Isink flows through the resistor 224. An example value for the resistor 224 is 300Ω, and an example value for the resistor 226 is 50Ω. The base-emitter voltage drop, $V_{BE}$, of the transistor device 228 and the voltage drop across the diode 236 should be substantially equal. The value of the resistor 224 is greater than the value of the resistor 226 so that more of the current, Isink, will go to the base 234 of the transistor device 228 and turn on the transistor device 228 more forcefully when the system voltage, Vcc, on connection 201 is relatively high. A more forceful turn-on of the transistor device 228 when Vcc is relatively high, leads to more negative current slope over Vcc.

Controlling the ratio of Iref/Isink allows a designer to then establish a number of different bias current profiles, based on a wide range of system voltage, Vcc.

Moreover, the resistor 214 and the diode 216 provide temperature compensation for the bias circuit 210. The resistor 214 has positive temperature coefficient and the diode 216 has negative temperature coefficient. Since the resistor 214 is relatively small, voltage across the resistor 214 and the diode 236 is primarily determined by the voltage drop across the diode 216, which has a negative temperature coefficient. At a fixed Vcc, the current, Isink, increases when the temperature increases. When the current, Isink, increases, the slope of bias current decreases and the slope of bias current over temperature will be flatter compared to a traditional current mirror bias circuit.

In addition, the bias circuit 210 eliminates the need for a regulated system voltage, and operates using only the system voltage, Vcc. Further, the operation of the transistor device 202 to cease the flow of current to connection 204 when the enable signal is deasserted minimizes any leakage current.

Figure 3:
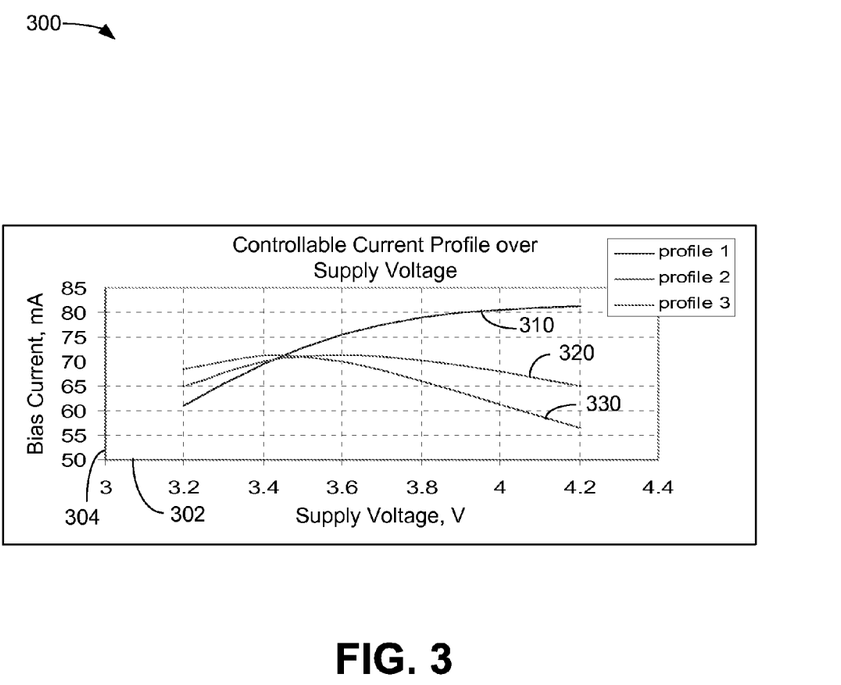
FIG. 3 is a graphical representation illustrating three different possible bias current profiles that can be implemented in the power amplifier of FIG. 2, over a range of supply voltages.

FIG. 3 is a graphical representation 300 illustrating three different possible bias current profiles that can be implemented in the power amplifier 200 of FIG. 2, over a range of supply voltages. The abscissa 302 represents supply voltage, or the voltage Vcc, and the ordinate 304 represents the bias current, in milliamps (mA), in an exemplary system. The traces 310, 320, and 330 represent three different bias current profiles, achievable by selectively choosing and or varying the value of the resistors 206, 212, 214, 224 and 226, and the diodes 216 and 236.

As an example, the value of the resistor 206 remains fixed at 750Ω and the value of the resistor 226 remains fixed at 50Ω. However, the values of the resistors 212, 214 and 224 are changed to result in the three profiles shown in FIG. 3.

For the profile illustrated using trace 310, a first stage (driver stage) of a power amplifier device has the value of resistor 212 set at 60Ω, the value of the resistor 214 set at 300Ω, and the value of the resistor 224 set at 350Ω. A second stage (output stage) of a power amplifier device has the value of resistor 212 set at 60Ω, the value of the resistor 214 set at 400Ω, and the value of the resistor 224 set at 450Ω.

For the profile illustrated using trace 320, a first stage (driver stage) of a power amplifier device has the value of resistor 212 set at 60Ω, the value of the resistor 214 set at 200Ω, and the value of the resistor 224 set at 300Ω. A second stage (output stage) of a power amplifier device has the value of resistor 212 set at 60Ω, the value of the resistor 214 set at 150Ω, and the value of the resistor 224 set at 300Ω.

For the profile illustrated using trace 330, a first stage (driver stage) of a power amplifier device has the value of resistor 212 set at 70Ω, the value of the resistor 214 set at 200Ω, and the value of the resistor 224 set at 300Ω. A second stage (output stage) of a power amplifier device has the value of resistor 212 set at 65Ω, the value of the resistor 214 set at 150Ω, and the value of the resistor 224 set at 300Ω.

Figure 4:
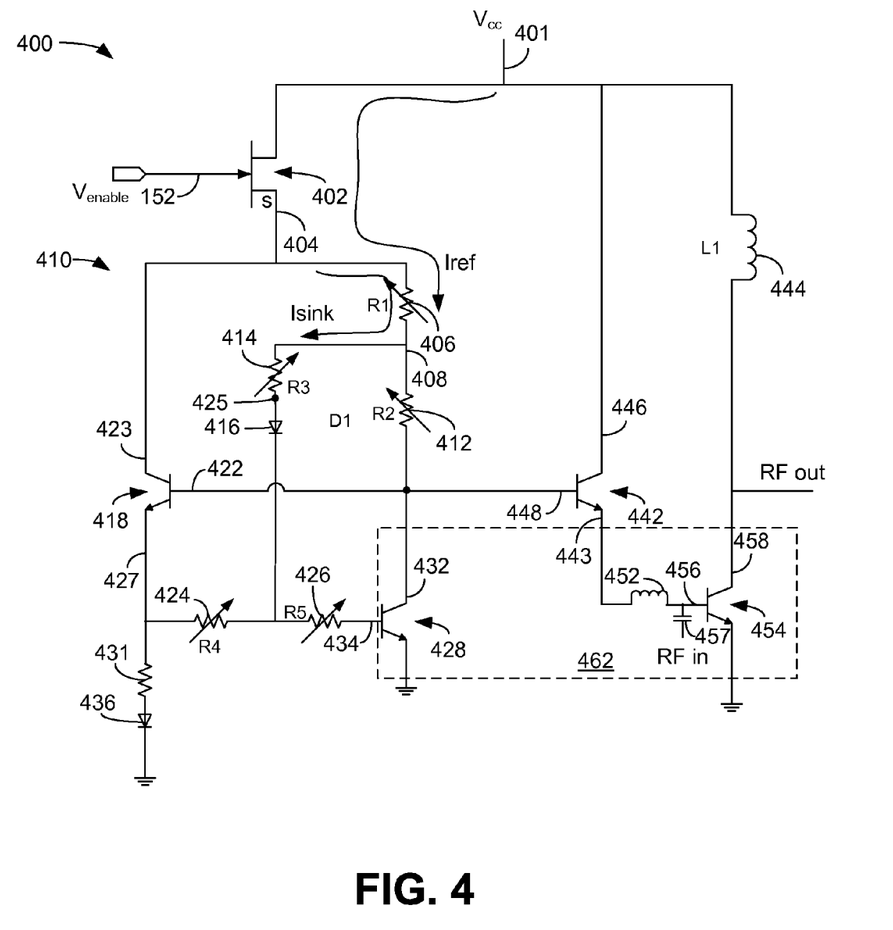
FIG. 4 is a schematic diagram illustrating a power amplifier system including an alternative embodiment of the power amplifier bias circuit having controllable current profile of FIG. 2.

FIG. 4 is a schematic diagram illustrating a power amplifier system including an alternative embodiment of the power amplifier bias circuit having controllable current profile of FIG. 2.

The power amplifier system 400 of FIG. 4 is similar to the power amplifier system 200 of FIG. 2, and like elements will be designated with the reference numeral nomenclature 4XX, where "XX" refers to a similar element in FIG. 2.

The power amplifier system 400 comprises bias circuit 410 that comprises a transistor device 402, which receives a supply system voltage signal, Vcc, which can also be referred to as a battery voltage signal, Vbatt, over connection 401. In an embodiment, the connection 401 forms the drain connection of the transistor device 402. In the embodiment shown in FIG. 4 the transistor device 402 is a field effect transistor (FET), and can be a metal oxide semiconductor (MOS) FET, a metal semiconductor (MES) FET, or any other type of FET.

An enable signal, supplied via connection 152, is provided to the gate terminal of the transistor device 402. When the enable signal on connection 152 is active, or logic high, the transistor device 402, acting as a switch, becomes conductive. When conductive, the source terminal 404 of the transistor device 402 communicates the voltage signal, Vcc, onto connection 404, which also forms the source terminal of the transistor device 402. By controlling the connectivity of the non-regulated supply system voltage signal, Vcc, to the bias circuit 410, the transistor device 402 also effectively minimizes leakage current when switched off by the enable signal 152.

The power amplifier system 400 also includes a transistor device 418, a transistor device 428, a transistor device 442 and a transistor device 454. The transistor device 454 represents one of a number of possible radio frequency (RF) power amplification stages. A radio frequency (RF) input signal is coupled to the base terminal 456 of the transistor device 454 through a capacitor 457. The collector terminal 458 of the transistor device 454 is coupled through an inductor 444 to the system voltage, Vcc, on connection 401. The collector terminal 458 of the transistor device 454 provides the RF output of the power amplifier system 400. The transistor devices 418, 428, 442 and 454 are bipolar junction transistor (BJT) devices, similar to the transistor device 218, 228, 242 and 254, described above.

In the embodiment described in FIG. 4, the resistors 406, 412, 414, 424, and 426 are implemented as variable resistances. For example, the resistors 406, 412, 414, 424, and 426 can be implemented using any of a variety of variable resistance devices.

In addition, the resistors 406, 412, 414, 424, and 426 can be implemented as continuously variable voltage controlled resistances, or as any variable resistance, as known in the art. The values of the resistors 406, 412, 414 and 424 determine the amount of current that flows through the transistor device 428, thereby controlling the power output of the transistor device 454. Therefore, the values of the resistors 406, 412, 414 and 424 can continuously control the profile of the bias current, thereby controlling the power output of the power amplifier system 400. The variable resistor 426 determines the bias current for the transistor device 428.

As a further control of the bias current, the diode 416 and the diode 436 adjust the DC voltage drop across the resistor 414, thus controlling the base current at the base terminal 434 of the transistor device 428. The current (Isink) in varies depending upon the voltage that appears at the node 425 between the resistor 414 and the diode 416. Depending upon the type of diode 416 implemented, the voltage at node 425 changes, thereby providing at least some adjustability, depending on the type of diode function implemented. In addition, the value of the resistor 424, and to a lesser degree, the value of the resistor 426 influences the current Isink because the majority of the current Isink flows through the resistor 424. By carefully selecting the values of the resistors 406, 412, 414, 424 and 426, and the parameters of the diodes 416 and 436, the ratio of the current Iref into the collector terminal 432 of the transistor device 428 to the current Isink through the resistance 414, can be determined based on a particular system voltage, Vcc. Controlling the ratio of Iref/Isink allows a designer to then establish a number of different continuously variable bias current profiles, based on a wide range of system voltage, Vcc.

Moreover, the resistor 414 and the transistor device 416 provide temperature compensation for the bias circuit 410, as described above.

Figure 5:
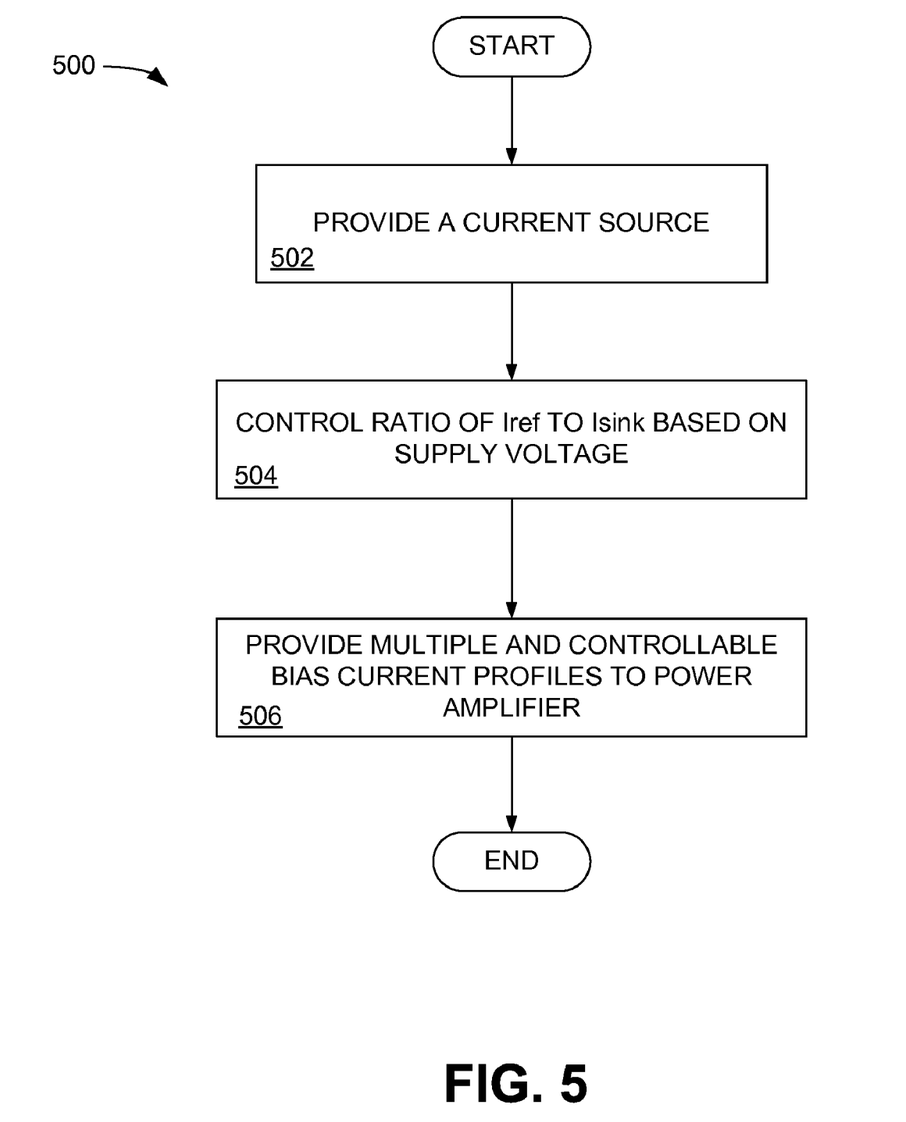
FIG. 5 is a flow chart describing the operation of an embodiment of the power amplifier bias circuit having controllable current profile of FIG. 2.

FIG. 5 is a flow chart describing the operation of an embodiment of the power amplifier bias circuit having controllable current profile of FIG. 2. In block 502, a current source is provided. In an embodiment, the current source can be a transistor device, such as transistor device 202 (FIG. 2). In block 504, the values of the resistors 206, 212, 214, 224, and 226 are chosen to control the ratio of the current Iref to the current Isink, based on the level of the system supply voltage, Vcc. In block 506, multiple bias current profiles are provided to the power amplifier.

While various embodiments of the invention have been described, it will be apparent to those of ordinary skill in the art that many more embodiments and implementations are possible that are within the scope of this invention.

What is claimed is:

1. A power amplifier bias circuit having a controllable current profile, comprising:
    a first transistor device configured as a switch and configured to receive a non-regulated system voltage; and
    a plurality of resistors configured to provide a current and configured to determine an amount of a bias current that flows through a second transistor device, where the second transistor device is part of a current mirror comprising a third transistor device and the amount of bias current flowing through the second transistor device determines a power output of the third transistor device.

2. The circuit of claim 1, in which a value of each of the plurality of resistors is chosen to result in a corresponding bias current that is related to a level of the non-regulated system voltage.

3. The circuit of claim 1, in which a value of each of the plurality of resistors is chosen to result in a corresponding bias current profile that changes over a range of the non-regulated system voltage.

4. The circuit of claim 1, in which when deactivated, the first transistor device substantially eliminates leakage current through the second transistor device.

5. The circuit of claim 1, in which at least one of the plurality of resistors is a variable resistor.

6. The circuit of claim 1, in which the bias current comprises a reference current, Iref, and a sink current, Isink, and in which the plurality of resistors determines a ratio of Iref/Isink, which establishes a bias current profile, based on the non-regulated system voltage.

7. The circuit of claim 1, further comprising a diode connected to at least one of the plurality of resistors, in which the diode and the at least one of the plurality of resistors provides temperature compensation for the power amplifier bias circuit.

8. A portable transceiver having a power amplifier bias circuit having a controllable current profile, comprising:
   a transmitter operatively coupled to a receiver;
   a power amplifier element including:
      a first transistor device configured as a switch and configured to receive a non-regulated system voltage; and
      a plurality of resistors configured to provide a current and configured to determine an amount of a bias current that flows through a second transistor device, where the second transistor device is part of a current mirror comprising a third transistor device and the amount of bias current flowing through the second transistor device determines a power output of the third transistor device.

9. The portable transceiver of claim 8, in which a value of each of the plurality of resistors is chosen to result in a corresponding bias current that is related to a level of the non-regulated system voltage.

10. The portable transceiver of claim 8, in which a value of each of the plurality of resistors is chosen to result in a corresponding bias current profile that changes over a range of the non-regulated system voltage.

11. The portable transceiver of claim 8, in which when deactivated, the first transistor device substantially eliminates leakage current through the second transistor device.

12. The portable transceiver of claim 8, in which at least one of the plurality of resistors is a variable resistor.

13. The portable transceiver of claim 8, in which the bias current comprises a reference current, Iref, and a sink current, Isink, and in which the plurality of resistors determines a ratio of Iref/Isink, which establishes a bias current profile, based on the non-regulated system voltage.

14. A method for biasing a power amplifier, comprising:
    configuring a first transistor device as a switch, the first transistor device provided with a non-regulated system voltage; and
    providing a plurality of resistors configured to provide a current and configured to determine an amount of a bias current that flows through a second transistor device, where the second transistor device is part of a current mirror comprising a third transistor device and the amount of bias current flowing through the second transistor device determines a power output of the third transistor device.

15. The method of claim 14, further comprising:
    selecting a value of each of the plurality of resistors to generate a corresponding bias current that is related to a level of the non-regulated system voltage.

16. The method transceiver of claim 14, further comprising:
    selecting a value of each of the plurality of resistors to generate a corresponding bias current profile that changes over a range of the non-regulated system voltage.

17. The method of claim 14, in which when deactivated, the first transistor device substantially eliminates leakage current through the second transistor device.

18. The method of claim 14, in which at least one of the plurality of resistors is a variable resistor.

19. The method of claim 14, in which the bias current comprises a reference current, Iref, and a sink current, Isink, and in which the plurality of resistors determines a ratio of Iref/Isink, which establishes a bias current profile, based on the non-regulated system voltage.

* * * * *